United States Patent [19]
Streckenbach

[11] 3,953,832
[45] Apr. 27, 1976

[54] REMOTE CONTROL OF BROADCAST RECEIVERS

[75] Inventor: Wulf-Christian Streckenbach, Hemmingen, Germany

[73] Assignee: Licentia Patent Verwaltungs-G.m.b.H., Frankfurt am Main, Germany

[22] Filed: Apr. 1, 1975

[21] Appl. No.: 564,218

[30] Foreign Application Priority Data
Apr. 5, 1974 Germany............................ 2416601

[52] U.S. Cl............................... 340/171 R; 328/63; 325/42; 343/228
[51] Int. Cl.²......................................... H04B 7/00
[58] Field of Search ............. 328/120, 63; 343/225, 343/228; 340/148, 147 F, 171 R; 325/390, 391, 392, 37, 42

[56] References Cited
UNITED STATES PATENTS

| | | | |
|---|---|---|---|
| 2,980,858 | 4/1961 | Grondin et al......................... | 328/63 |
| 3,350,580 | 10/1967 | Harrison.............................. | 328/120 |
| 3,611,297 | 10/1971 | Kramer................................ | 340/148 |
| 3,855,575 | 12/1974 | Leuschner et al............... | 340/171 R |

*Primary Examiner*—George H. Libman
*Attorney, Agent, or Firm*—Spencer & Kaye

[57] ABSTRACT

Circuit arrangement in a remote control receiver unit for evaluating received remote control signals by counting the number of periods, particularly of ultrasonic oscillations for the remote control of a radio or television set, the arrangement including an oscillator producing oscillations which are utilized for the evaluation, and which have a frequency higher than the frequency of the received oscillations, a counter connected to receive the higher frequency oscillations and to be controlled by the received oscillations so that when the received oscillations are present the counter emits a pulse during each of the received oscillation periods and when no received oscillations are present due to interference, the oscillator oscillations are divided by the counter to the frequency of the received oscillations so that interruptions in the received oscillations have no influence on the subsequent circuit portions.

10 Claims, 9 Drawing Figures

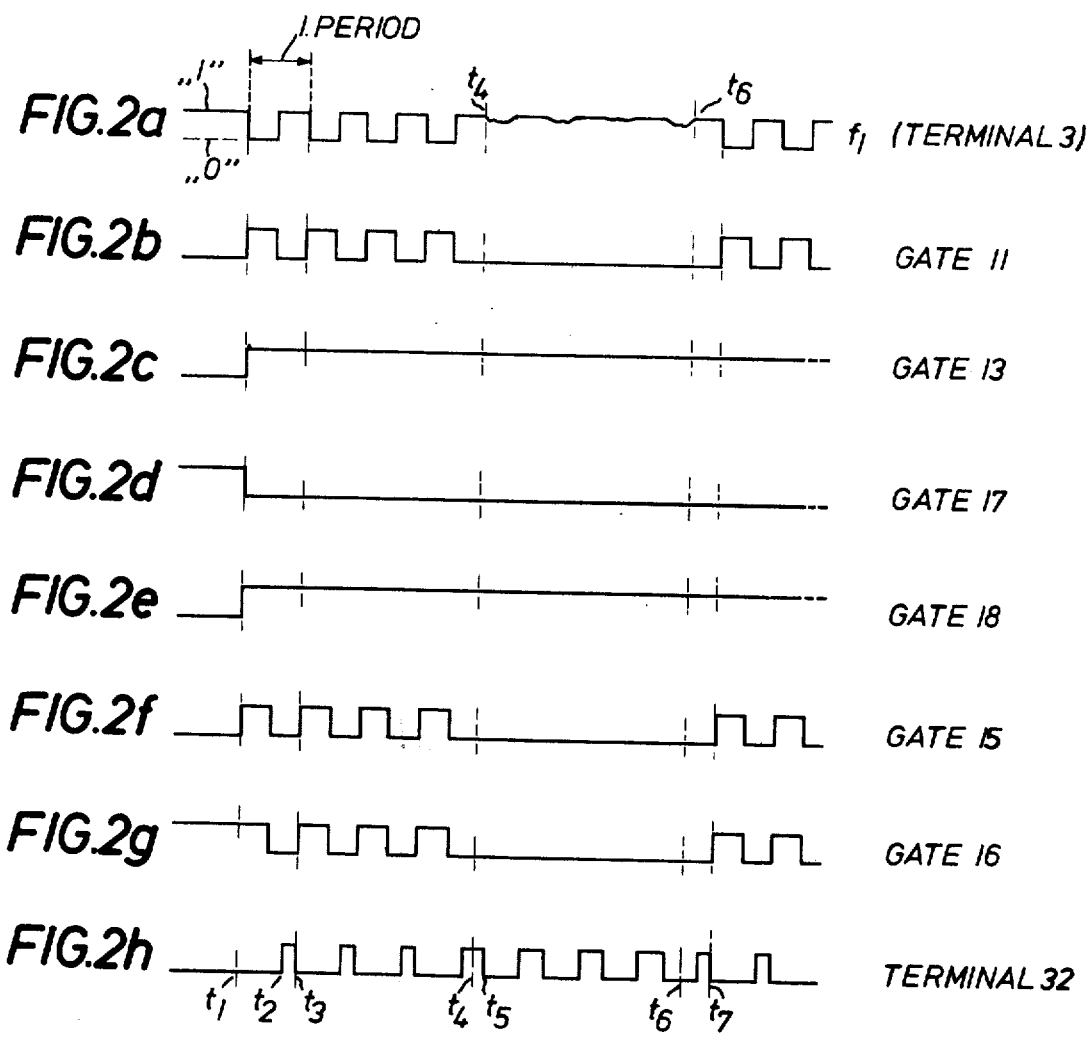

REMOTE CONTROL OF BROADCAST RECEIVERS

BACKGROUND OF THE INVENTION

The present invention relates to remote control devices for controlling the operation of broadcast receivers, and relates particularly to ultrasonic devices of this type.

There exists in commerce a constantly increasing demand for ultrasonic remote-control devices for controlling broadcast receivers, for example television sets. Such devices are employed to control, from a distance, various functions, such as, for example, switching on and off, channel selection, volume adjustment, etc. For this purpose it is necessary to provide an ultrasonic transmitter as well as an ultrasonic receiver. When the key, or button, on the ultrasonic transmitter corresponding to the desired function is actuated, the transmitter emits ultrasonic oscillations which contain the control instruction required for effecting the desired operating function and which are received and appropriately evaluated by the ultrasonic receiver.

However, remote control with ultrasonic devices is difficult in that interferences may occur in the transmission path, the path over which ultrasonic waves travel from the transmitter to the receiver, so that the received ultrasonic oscillations do not coincide with the transmitted oscillations. Such interference may be, for example, that the received ultrasonic oscillation temporarily has too low an amplitude so that it cannot be evaluated by the ultrasonic receiver. As a result, errors in switching occur and a function other than the desired one, or no operating function at all, is performed.

SUMMARY OF THE INVENTION

It is an object of the present invention to overcome this difficulty and to thus assure error-free evaluation of ultrasonic oscillations which are temporarily missing during the transmission.

The invention involves a circuit arrangement for evaluating received remote control signals by counting the number of periods, particularly of ultrasonic oscillations, for the remote control of a radio or television set.

The objects according to the present invention are achieved by a circuit arrangement which forms part of an ultrasonic receiver and which includes an oscillator, the oscillations of which are utilized for the evaluation and which are at a frequency higher than the frequency of the received oscillations. The oscillations from this oscillator are fed to a counter which is controlled by the received oscillations in such a manner that when such received oscillations are present during each one of their periods, the counter emits a pulse and if no oscillations are received due to interference the oscillator oscillations are divided by the counter to the frequency of the received oscillations so that interruptions of the received oscillations have no adverse influence on the operation of the circuitry of the succeeding portion of the receiver.

Error-free evaluation of the information contained in the number of periods of the received ultrasonic oscillations, i.e. the control instruction, is thus achieved by the higher frequency oscillator oscillations generated at the receiving end being divided down to the known frequency of the received ultrasonic oscillations by the counter, if such ultrasonic oscillations are missing. The frequency-reduced oscillator oscillations thus replace, in the subsequent circuit portions, the ultrasonic oscillations which should have been received during that period of time.

When the interference ends, so that ultrasonic oscillations of sufficient amplitude are again being received, the counter is switched so that it no longer operates as a divider stage. In this case the oscillator oscillations, however, continue to be evaluated but the received ultrasonic oscillations influence the counter in such a manner that a pulse from the counter will reach the subsequent circuit portion during each of the received oscillation periods. Due to the fact that the number of periods is evaluated, the so-called Doppler effect which results in a change in frequency is unable to exert any influence. The cause of the Doppler effect can be a movement of the transmitter during its operation.

BRIEF DESCRIPTION OF THE DRAWING

FIGS. 2a–2h are diagrams showing a series of waveforms used to explain the operation of the circuit of FIG. 1.

DESCRIPTION OF THE PREFERRED EMBODIMENTS

Figure 1:
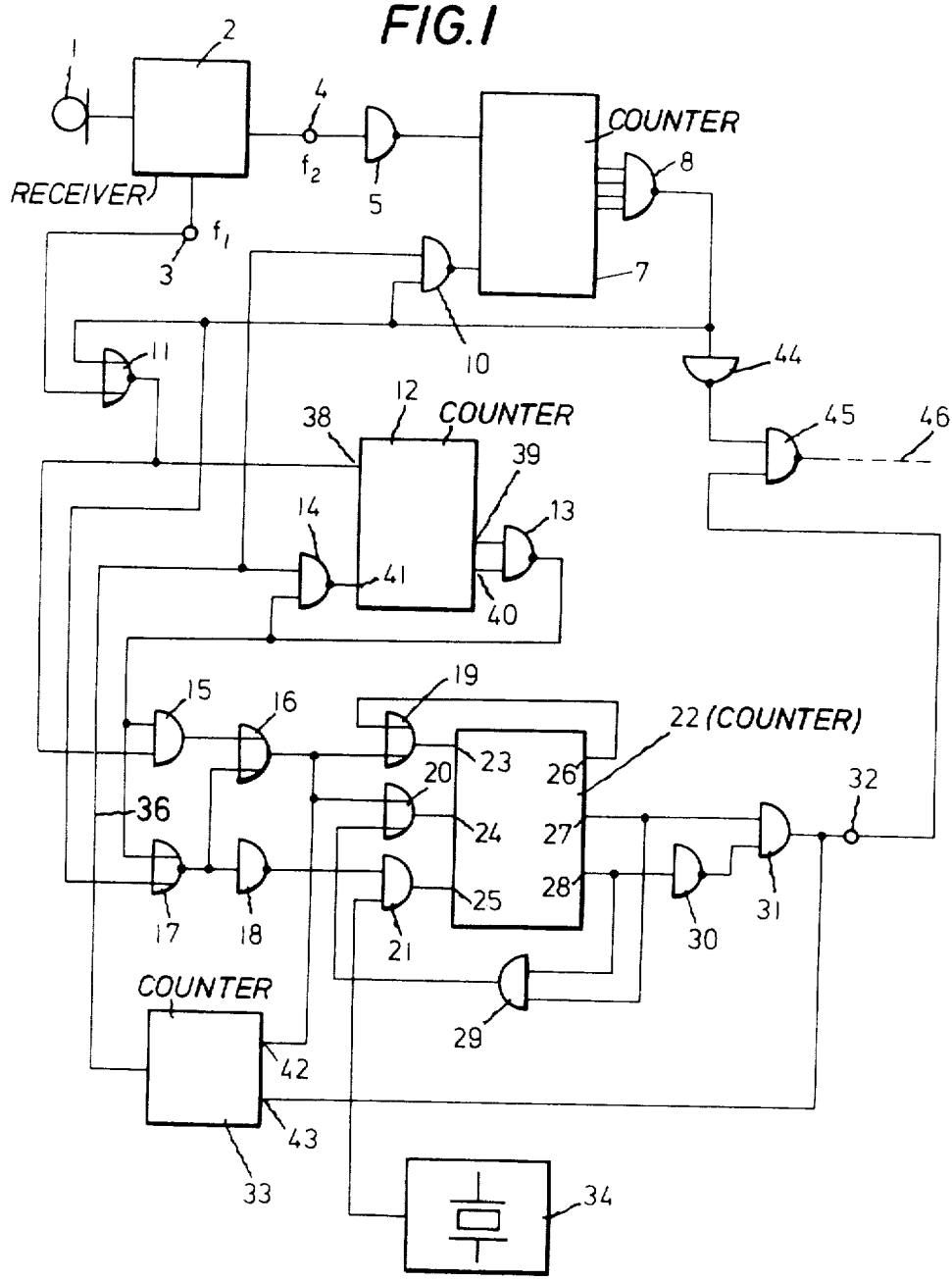
FIG. 1 is a basic circuit diagram of a preferred embodiment of the circuit arrangement of the present invention.

The circuit shown in FIG. 1 includes a microphone 1 arranged to receive the ultrasonic signals transmitted by an ultrasonic transmitter (not shown). Microphone 1 converts these signals to a corresponding electrical signal which is supplied to the input of a receiver 2. The complete ultrasonic signal being transmitted includes two ultrasonic signals which have different frequencies $f_1$ and $f_2$ and which are transmitted in immediate succession to one another.

The first frequency to be transmitted and received, frequency $f_1$, serves to identify the nature of the control instruction, e.g., the program selection or analog function, while the following frequency, $f_2$, constitutes the actual control instruction.

The receiver 2 includes, inter alia, in a known manner, two resonant circuits tuned to the frequencies $f_1$ and $f_2$, respectively. At each of output terminals 3 and 4 of the receiver 2, a signal voltage corresponding to logic state "1" is present when no ultrasonic signal at frequency $f_1$ or $f_2$, respectively, is being received. If an ultrasonic signal at frequency $f_1$ is received, and the period of each cycle at frequency $f_1$ is treated as being composed as two half periods, a signal voltage corresponding to logic state "0" will appear at output terminal 3 during the first half period and logic state 1 during the second half period. The same applies for output terminal 4 with respect to the signal at frequency $f_2$. For the sake of simplicity, the logic states will hereinafter be identified simply as 0 and 1.

The circuit of FIG. 1, and its operation, will be described in detail, with reference to FIGS. 2a–2h which show the waveforms of the signals at various points in the circuit, with respect to time, $t$. It is initially assumed that no interference exists and the first period of the received ultrasonic oscillation at frequency $f_1$ is being considered.

FIG. 2a shows that at the beginning $t_1$ of the first period, a 0 is present at terminal 3 of FIG. 1 and thus also at the lower input of a NOR gate 11. As long as no ultrasonic oscillations of the other frequency $f_2$ are being received, a 0 will be present at the upper input of NOR gate 11, for reasons to be explained below, so that the output of NOR gate 11 will provide a 1 during the first half of the period under consideration, as shown in FIG. 2b. This 1 at the output of gate 11 is fed to the reset input 38 of a counter 12 which forms a monostable multivibrator stage together with NAND gates 13 and 14, and which constitutes the timing member of such monostable stage.

Due to the 1 at the reset input 38, the monostable flip stage 12, 13, 14 is triggered, thus initiating its astable state and producing a 1 at the output of NAND gate 13, the output of gate 13 being shown in FIG. 2c. Counter 12 can count pulses fed to its counting input 41 through a line 36 until a counting state has been reached which is associated with the two selected outputs 39 and 40 to which NAND gate 13 is connected, i.e. until a predetermined number of count pulses has been counted. The 1 present during this counting interval at the output of NAND gate 13 is also present at the respective upper inputs of AND gate 15 and NOR gate 17.

Because of the logic relationships established by gates 15, 16, 17 and 18, a 1 is present during the first half of the $t_1-t_3$ period under consideration at the upper input of AND gate 21 as well as at the two reset inputs 23, 24 of a counter 22, as illustrated by the waveforms in FIGS. 2d, 2e, 2f and 2g, which depict the outputs from gates 17, 18, 15 and 16, respectively. The counter 22 is free to count only if a 0 is present at one or both of its two reset inputs 23 and 24. The output oscillator oscillations supplied from a quartz oscillator 34 to the counting input 25 of counter 22 via an AND gate 21 and thus not counted during the first half of the period $t_1-t_3$. The frequency of the oscillator oscillations is selected, for example, to be thirteen times as high as $f_1$.

With the beginning of the second half of the period $t_1-t_3$ a 0 appears at the output of NOR gate 11. While the outputs of NAND gates 13 and 18 remain at 1 and the output of NOR gate 17 remains at 0, the logic state at AND gate 15 changes from 1 to 0 so that a 0 will also appear at the two reset inputs 23 and 24 of counter 22. Thus counter 22 is free to count and begins to count the quartz oscillator oscillations received at its counting input.

In dependence on the current counting state of counter 22, logic 0 or 1 states appear at the illustrated outputs 26, 27 and 28 thereof. For example, a 1 appears at output 27 and a 0 at output 28 after four oscillator pulses have been counted. Due to the logic linkage provided by an inverter 30 and an AND gate 31, a 1 will then appear at terminal 32 at time $t_2$, as shown in FIG. 2h, which illustrates the signal at terminal 32. During a selected number of succeeding pulses from oscillator 34, the logic states at outputs 27 and 28 remain unchanged so that the 1 at terminal 32 also remains. At the end of the second half of the period under consideration, at time $t_3$, the counter 22 is reset via OR gates 16, 19 and 20 since the reset inputs 23, 24 are then reset to 1. Thus the potential at terminal 32 changes from 1 to 0 because all of the outputs of counter 22 are at 0.

The pulse signal produced in this manner at terminal 32 per period of the ultrasonic oscillations at frequency $f_1$ is fed, via a NAND gate 45 and a line 46, to a circuit for further evaluation (not shown) where these pulses are counted. Such an evaluation circuit is described, for example, in the periodical *Funkschau*, Issue No. 18, 1973, at pgs. 675–677. As long as a 0 is present at the output of a NAND gate 8, whose inputs are connected to outputs of a counter 7 to be described below, a 1 is present, from an inverter 44, at the upper input of NAND gate 45, so that this gate will pass pulses supplied to its other input from terminal 32.

In the case thus far under consideration, where no interference has occurred, the received ultrasonic oscillation thus effects the control of counter 22. This counter 22 is enabled to count the pulses from oscillator 34 only during the second half of each period when, with the selected logic linkage of its two outputs 27 and 28, a pulse can appear at terminal 32 and thus also at the output of NAND gate 45.

The following is a description of the operation of the circuit of the present invention in the case of interference where the received ultrasonic signal at frequency $f_1$ is temporarily effectively missing in that its amplitude is too low, and no ultrasonic oscillation at the other frequency $f_2$ has yet been received. Let is be assumed that the received ultrasonic oscillation at time $t_4$, i.e. at the end of the fourth period from time $t_1$ as shown in FIG. 2a, has such a low intensity, or amplitude, that the output of NOR gate 11 remains at 0, so that the monostable stage formed by counter 12 and NAND gates 13 and 14 is not retriggered and remains in its astable state. Since a 0 continues to be present at the output of NOR gate 11, the output of OR gate 16 also remains at 0. As a result, counter 22 is not reset as in the case discussed above but continues to count, even after time $t_4$, the oscillator pulses which are being fed to its counting input 25, as illustrated in FIG. 2h. The pulse thus produced at terminal 32 is therefore wider than before.

Because of the missing ultrasonic oscillations, counter 22 is no longer influenced by these oscillations and operates as a frequency, or pulse rate, divider which divides the oscillator pulses from oscillator 34 in such a way that pulses appear at terminal 32 at frequency, or repetition rate, of $f_1$.

The desired frequency division of the oscillator pulses is effected by AND gate 29 or OR gates 19 and 20 which are connected to provide pulses which cause counter 22 to be reset periodically. The output terminals 27 and 28 are selected, in a known manner, so that at time $t_5$ the potential at terminal 32 changes from 1 to 0 before the counter is reset. This occurs whenever a 1 is present at both reset inputs 23, 24, this being the case in the present situation after arrival of every group of thirteen oscillator pulses.

The maximum period of time during which counter 22 operates as a divider when the ultrasonic signal at frequency $f_1$ is missing, is determined by the astable state of the monostable stage 12, 13, 14. At the end of the astable state, a 0 appears at the output of NAND gate 13 so that a 1 will appear at the reset inputs 23 and 24 of counter 22 via gates 16, 17, 19, 20, whereby the counter is blocked. In addition, a 0 is then present at the upper input of AND gate 21 so that oscillations can no longer reach counting input 25 from oscillator 34.

The time duration of the above-mentioned astable state of the monostable stage 12, 13, 14 is dimensioned so that it is longer than the empirically determined duration of the occurring interruptions in the ultrasonic oscillations. The frequency $f_1$ of the pulses at terminal 32 can be 35 kHz, for example.

The pulses at terminal 32 are also fed to the counting input 43 of a further counter 33 which has a 0 at its reset input 42 in the case under consideration and effects a frequency division of, for example, 32:1. Thus pulses at a frequency of almost 1 kHz reach the counting input 41 of counter 12 as long as gate 13 has a 1 at its output, i.e. during the astable state of stage 12, 13, 14. This counter 12 is connected, for example, so that after ten pulses at its counting input 41 a 0 will appear at the output of NAND gate 13, thus terminating the astable state after about 9 ms unless the ultrasonic signal at frequency $f_1$ are again being received and monostable stage 12, 13, 14 has been prematurely triggered to remain in its astable state.

Generally, any undesired interruption of the ultrasonic signals is terminated before the above-mentioned 9 ms interval has expired. In FIG. 2a it is assumed that the interruption ceases at time $t_6$. Then, at time $t_7$ a 1 appears at the output of NOR gate 11 and thus also at the two reset inputs 23 and 24. Counter 22 is reset and no longer operates as an independent divider.

At the same time, the monostable stage 12, 13, 14 is triggered again so that a 1 continues to be present at the output of NAND gate 13. FIG. 2h shows that in spite of the temporary interruption of the ultrasonic oscillations, pulses at frequency $f_1$ appear at terminal 32 in uninterrupted succession so that a subsequent circuit can evaluate the number of periods of transmitted ultrasonic oscillations in any case without errors.

The circuit includes a further counter 7 which, together with NAND gates 8 and 10, also constitutes a monostable multivibrator stage which is triggered via an inverter 5 when an ultrasonic signal of the other frequency $f_2$ appears for the first time at terminal 4. This ultrasonic oscillation serves to execute the control instruction identified by the immediately previously received ultrasonic oscillations at the other frequency $f_1$. When the monostable stage 7, 8, 10 is initially triggered by the ultrasonic signal at frequency $f_2$, a 1 appears at the output of NAND gate 8 and thus also at the upper input of NOR gate 11. Thus NOR gate 11 is blocked so that ultrasonic oscillations at frequency $f_1$ which might still be received as a result of echoes have no influence. Pulses at frequency $f_1$ still appear at terminal 32, since counter 22 operates as a divider. However, NAND gate 45 is now blocked by the presence of a 0 at the output of inverter 44 so that no pulses can reach the subsequent circuit portion (not shown) via line 46 when ultrasonic signals at frequency $f_2$ are being received.

Counter 22 continues to operate as divider as long as ultrasonic signals at frequency $f_2$ continue to trigger the monostable stage 7, 8, 10, i.e. as long as this stage 7, 8, 10 remains in its astable state, with the output of NAND gate 8 producing a 1. Gates 11, 15, 16, 17, 19, and 20 set the reset inputs 23, 24 of counter 22 to 0. After the last triggering of monostable stage 7, 8, 10 by frequency $f_2$ the timing element of this stage becomes effective. The counting pulses of counter 33 travel via NAND gate 10 to the counting input of counter 7. This process is concluded as soon as a 0 appears at the output of NAND gate 8. Then gates 15, 16, 17, 18, 19, 20 and 21 also block operation of counter 22 and the frequency division of the oscillator 34 oscillations is terminated.

It will be understood that the above description of the present invention is susceptible to various modifications changes and adaptations, and the same are intended to be comprehended within the meaning and range of equivalents of the appended claims.

What is claimed is:

1. In a circuit arrangement for evaluating received remote control alternating signals by counting the number of periods thereof, the improvement comprising: an oscillator producing oscillations which are utilized for the signal evaluation, the frequency of the oscillations produced by said oscillator being higher than the frequency of the received alternating signals; a counter; and means connecting said oscillator and the received alternating signals to said counter, said connecting means being controlled by the received alternating signals in a manner such that when the received signals are present at a sufficient amplitude said counter emits a pulse during each received signal period and when the received signals have insufficient amplitude due to interference, said counter frequency-divides the oscillator oscillations down to the frequency of the received signals, whereby interruptions in the received signals have no influence on the operation of subsequent circuit portions of said arrangement.

2. A circuit as defined in claim 1 wherein said counter includes reset inputs for receiving a logic value to reset said counter, and said connecting means comprises means defining a first logic linkage connected to said reset inputs and arranged to respond to received signals present at such sufficient amplitude for causing said counter to be maintained in its reset state during each first half period of each cycle of such received signals and to count the oscillator oscillations during each second half period of each such cycle.

3. A circuit as defined in claim 2 wherein said counter includes count outputs for providing binary signals representing the counting state of said counter, and further comprising means defining a second logic linkage connected to said count outputs and arranged to produce, during each such second half period of a signal present at such sufficient amplitude, a pulse having a longer duration than the period of the oscillations produced by said oscillator.

4. A circuit as defined in claim 3 wherein the oscillations produced by said oscillator are at a frequency which is thirteen times the frequency of the remote control alternating signals, and each pulse produced by said second logic linkage means begins after said counter has counted four oscillator oscillations following the start of such second half period and terminates at the end of such second half period during each cycle of received signals present at such a sufficient amplitude.

5. A circuit as defined in claim 3 wherein, when the received signals have such insufficient amplitude, said first logic linkage means are further arranged for causing said count outputs to produce binary values which result in the production of a pulse at the output of said second logic linkage means after at least one oscillator oscillation has been supplied to said counter, which pulse has a period longer than the oscillator oscillation period.

6. A circuit as defined in claim 5 wherein selected ones of said count outputs of said counter are connected to said first logic linkage means for causing, when the received signals have such insufficient amplitude, logic values to be applied to said counter reset inputs to reset said counter before it has counted the number of oscillator oscillations occurring during one cycle of such received signals, and for causing said counter to recommence counting oscillator oscillations, whereby said counter operates as a frequency divider with respect to the oscillator oscillations.

7. A circuit as defined in claim 1 further comprising: a first monostable multivibrator unit having a trigger input for receiving a trigger voltage capable of placing said unit in its astable state, said unit being arranged to be maintained in its astable state by the application of such trigger voltage to its said trigger input at a time when said unit is already in its astable state, said unit having its trigger input connected to receive such trigger voltage in response to the presence of such received signals at such sufficient amplitude; and a second monostable multivibrator unit; both of said monostable units being operatively connected to said counter for blocking counting by said counter when both said monostable units are in their stable state.

8. A circuit as defined in claim 7, additionally comprising a further counter having a count output, and wherein said first monostable unit comprises: a counting member having a reset input constituting said trigger input and connected for responding to such received signals at such sufficient amplitude, said counting member further having a counting input; a first NAND gate having its output connected to said counting input of said counting member and having a first input connected to said count output of said further counter for enabling the count produced by said counting member to be controlled by the count pulses produced by said further counter; and a second NAND gate having inputs connected to selected outputs of said counting member for producing an output voltage having a selected value when said counting member has executed a selected count corresponding to the astable period of said first monostable unit, the output of said second NAND gate being connected to a second input of said first NAND gate for enabling said first gate only during an astable period of said first monostable unit.

9. A circuit as defined in claim 8 wherein the pulses produced at the count output of said further counter have a frequency which is a fraction of the frequency of the alternating signals and which has a value of about 1 kHz, and said first monostable unit has an astable period longer than the period during which received signals would normally have insufficient amplitude.

10. A circuit as defined in claim 1 wherein said alternating signals have a first frequency and further comprising a controllable gate connected to normally supply such signals which are present at such sufficient amplitude to said counter and to effectively prevent said counter from being controlled by such alternating signals when alternating signals having a selected second frequency, different from said first frequency, are received by said circuit arrangement.

* * * * *